United States Patent [19]
Ikeuchi

[11] Patent Number: 5,495,119
[45] Date of Patent: Feb. 27, 1996

[54] MOS THIN FILM TRANSISTOR HAVING HIGH BREAKDOWN VOLTAGE

[75] Inventor: Hideki Ikeuchi, Tokyo, Japan

[73] Assignee: NEC Corporation, Japan

[21] Appl. No.: 96,675

[22] Filed: Jul. 23, 1993

[30] Foreign Application Priority Data

Jul. 23, 1992 [JP] Japan .................... 4-195753

[51] Int. Cl.$^6$ .......... H01L 29/76; H01L 29/94; H01L 31/062; H01L 31/113
[52] U.S. Cl. .............. 257/365; 257/59; 257/72; 257/366
[58] Field of Search ................. 257/365, 366, 257/347, 348, 349, 59, 72; 359/59

[56] References Cited

U.S. PATENT DOCUMENTS

| | | | |
|---|---|---|---|
| 3,470,610 | 10/1969 | Breitweiser | 257/365 |
| 4,528,480 | 7/1985 | Unagami et al. | 315/169.1 |
| 4,974,056 | 11/1990 | Brodsky et al. | 257/770 |
| 5,079,606 | 1/1992 | Yamamura et al. | 257/365 |
| 5,140,391 | 8/1992 | Hayashi et al. | 257/365 |
| 5,278,102 | 1/1994 | Horie | 257/510 |

FOREIGN PATENT DOCUMENTS 334669  5/1991  Japan .

*Primary Examiner*—Sara W. Crane
*Attorney, Agent, or Firm*—Laff, Whitesel, Conte & Saret, Ltd.

[57] ABSTRACT

A MOS TFT includes a back gate electrode of a silicide formed on an underlying insulating layer, and a polysilicon layer deposited on the underlying insulating layer so as to completely cover the back gate electrode. A gate oxide and a gate electrode are formed on the polysilicon layer in the named order and positioned above the back gate electrode. In alignment with the gate oxide and the gate electrode, a pair of high concentration source/drain regions are formed in the polysilicon layer, so that a channel is formed by a portion of the polysilicon layer under the gate oxide. The whole is coated with a CVD oxide silicon protection film, and a source/drain electrode is formed to contact to each of the source/drain regions through a contact hole formed through the oxide silicon protection film. By fixing a potential of the back gate, a source-drain breakdown voltage can be considerably increased.

5 Claims, 4 Drawing Sheets

MOS THIN FILM TRANSISTOR HAVING HIGH BREAKDOWN VOLTAGE

BACKGROUND OF THE INVENTION

1. Field of the Invention

The present invention relates to MOS (metal-oxide-semiconductor) thin film transistor (called a "TFT" in this specification).

2. Description of Related Art

TFTs, which can be formed on an insulating film or layer, are now widely used as a load element for a high speed SRAM (static random access memory) or as an active matrix driving element in a color LCD (liquid crystal display).

One typical example of conventional TFTs is shown in JP-B2-91-34699 (Japanese Post-examination Patent Publication No. Hei 3-34699). The shown conventional TFT is formed as follows: First, a polysilicon layer is deposited on an underlying insulating layer, and a gate oxide film and a gate electrode are formed on the polysilicon layer in the named order. By using the stacked layer of the gate electrode and the gate oxide film as a mask, impurity is doped into the polysilicon layer so that a channel region is formed under the stacked layer of the gate electrode and the gate oxide film and a pair of source/drain regions are formed at opposite sides of the channel region. Then, a surface protection layer of an oxide silicon is deposited to cover the gate electrode and the source/drain regions, and a contact hole is formed on a surface protection layer portion above each of the source/drain regions. A source/drain electrode of aluminum is formed in each contact hole. Thus, a TFT device is completed.

In the above mentioned TFT, the channel formed of the polysilicon layer is maintained at a floating potential, differently from a MOS field effect transistor formed on a silicon substrate. Because of this, an electric field is concentrated in a drain end, and carriers generated by an impact ionization are accumulated in the polysilicon layer, so that a source-channel region is biased in a forward direction. As a result, a source-drain breakdown voltage greatly lowers. In order to prevent this drop of the source-drain breakdown voltage, there has been adopted an offset structure in which a pair of source/drain electrodes are formed separately from the gate electrode by some distance "L".

However, in a process for manufacturing the TFT having the above mentioned offset structure, an alignment error of the source/drain in relation to the gate electrode is inevitable, and therefore, dispersion of characteristics is large.

In addition, when the TFT is used as the LCD driving element, a TFT having a breakdown voltage not less than 10 V becomes necessary. In a conventional N-channel TFT, however, a sufficient source-drain breakdown voltage could not have been obtained only with the offset structure.

SUMMARY OF THE INVENTION

Accordingly, it is an object of the present invention to provide a TFT which has overcome the above mentioned defect of the conventional one.

Another object of the present invention is to provide a TFT having an increased source-drain breakdown voltage.

Still another object of the present invention is to provide a TFT having an increased source-drain breakdown voltage and having a reduced dispersion of the characteristics.

The above and other objects of the present invention are achieved in accordance with the present invention by a MOS thin film transistor comprising an underlying insulating layer, a back gate electrode formed on an upper surface of the underlying insulating layer, a channel region formed of a polysilicon layer deposited to cover at least a portion of the back gate electrode, a gate oxide formed on the channel region, a gate electrode formed on the gate oxide, and a pair of source/drain regions of a polysilicon layer formed at opposite sides of the channel region and contiguous to the channel regimen, each of the source/drain regions having an impurity concentration higher than that of the channel region.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the TFT in accordance with the present invention will be explained with reference to FIGS. 1A to 1D, which are diagrammatic sectional views of the TFT illustrating a process of manufacturing the first embodiment of the TFT in accordance with the present invention.

Figure 1A:
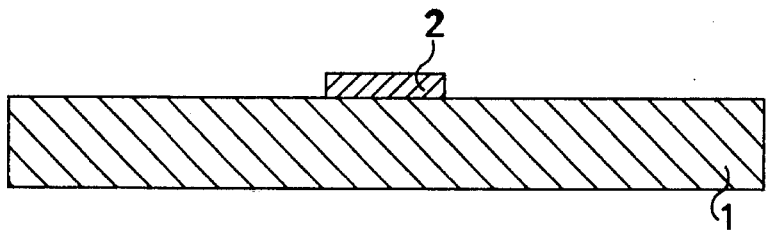
FIGS. 1A to 1D are diagrammatic sectional views of the TFT illustrating a process of manufacturing a first embodiment of the TFT in accordance with the present invention.

First, a silicide layer having a thickness on the order of 20 nm to 30 nm is deposited on an underlying insulating layer 1 as shown in FIG. 1A, and selectively removed by a dry etching process using as a mask a patterned resist layer (not shown) selectively formed on the silicide layer. Thereafter, the resist is removed, so that a back gate electrode 2 of the silicide layer is formed on the underlying insulating layer 1, as shown in FIG. 1A.

Generally, the silicide layer can be formed of WSi, TiSi, TaSi, etc. However, if succeeding processes are carried out at a low temperature of 400° C. to 600° C. inclusive, the back gate electrode can be formed of a metal such as W, Ti, Cr, etc. in place of the silicide.

Figure 1B:
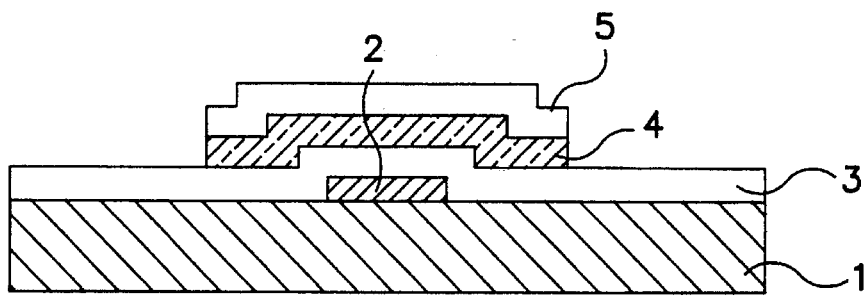

Thereafter, a polysilicon layer 3 having a thickness of 100 nm (which will constitute a channel layer (active layer) and source/drain regions of a possible TFT), an oxide layer having a thickness of 100 nm, and an upper polysilicon layer having a thickness of 150 nm are deposited on the underlying insulating layer 1 in the named order so as to completely cover the back gate electrode 2. Phosphorus is ion-implanted into the stacked layers, and an oxide film formed in a surface is removed. Then, the upper polysilicon layer and the oxide layer are patterned by a dry etching process using as a mask a patterned resist layer (not shown) selectively formed on the upper polysilicon layer, and the resist is removed so that a gate oxide film 4 and a gate electrode 5 are formed, as shown in FIG. 1B. In this case, the back gate electrode 2 is substantially positioned at a center of the gate oxide film 4 and the gate electrode 5.

Figure 1C:
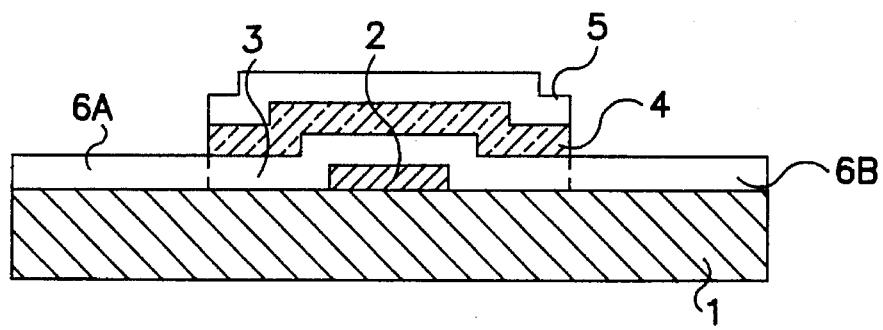

Furthermore, by using the stacked structure of the gate oxide film 4 and the gate electrode 5 as a mask, arsenic is ion-implanted under an acceleration voltage of 70 KeV so that a high concentration N-type source region 6A and a high concentration N-type drain region 6B having a carrier concentration of $1 \times 10^{20}$ cm$^{-3}$ are formed in the polysilicon layer 3 in alignment with the stacked structure of the gate oxide film 4 and the gate electrode 5, as shown in FIG. 1C. Therefore, a channel region is formed directly under the gate oxide film 4, contiguously to the high concentration N-type source region 6A and the high concentration N-type drain region 6B.

Figure 1D:
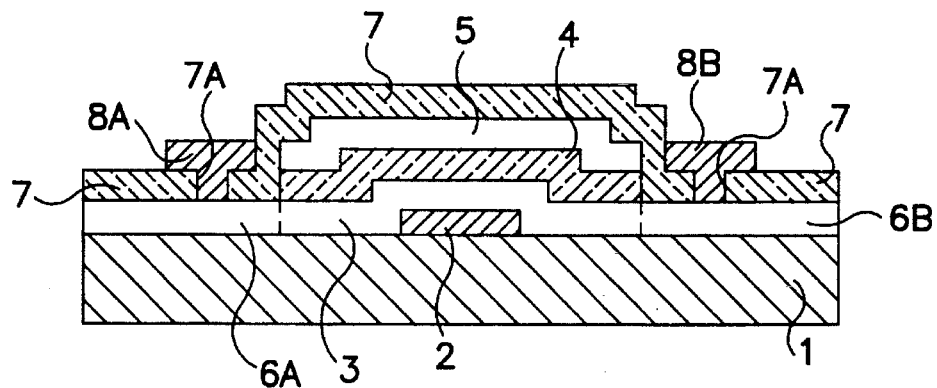

Thereafter, as shown in FIG. 1D, a surface protection layer 7 formed of a CVD (chemical vapor deposition) oxide silicon film having a thickness of 400 nm is deposited to completely cover the source region 6A and the drain region 6B and the stacked structure of the gate oxide film 4 and the gate electrode 5, and then, a contact hole 7A is formed through a portion of the surface protection layer 7 above each of the source region 6A and the drain region 6B. An aluminum film is deposited and selectively patterned so that a source electrode 8A and a drain electrode 8B of aluminum are respectively formed in contact with the source region 6A and the drain region 6B through the contact hole thus formed.

Figure 4A:
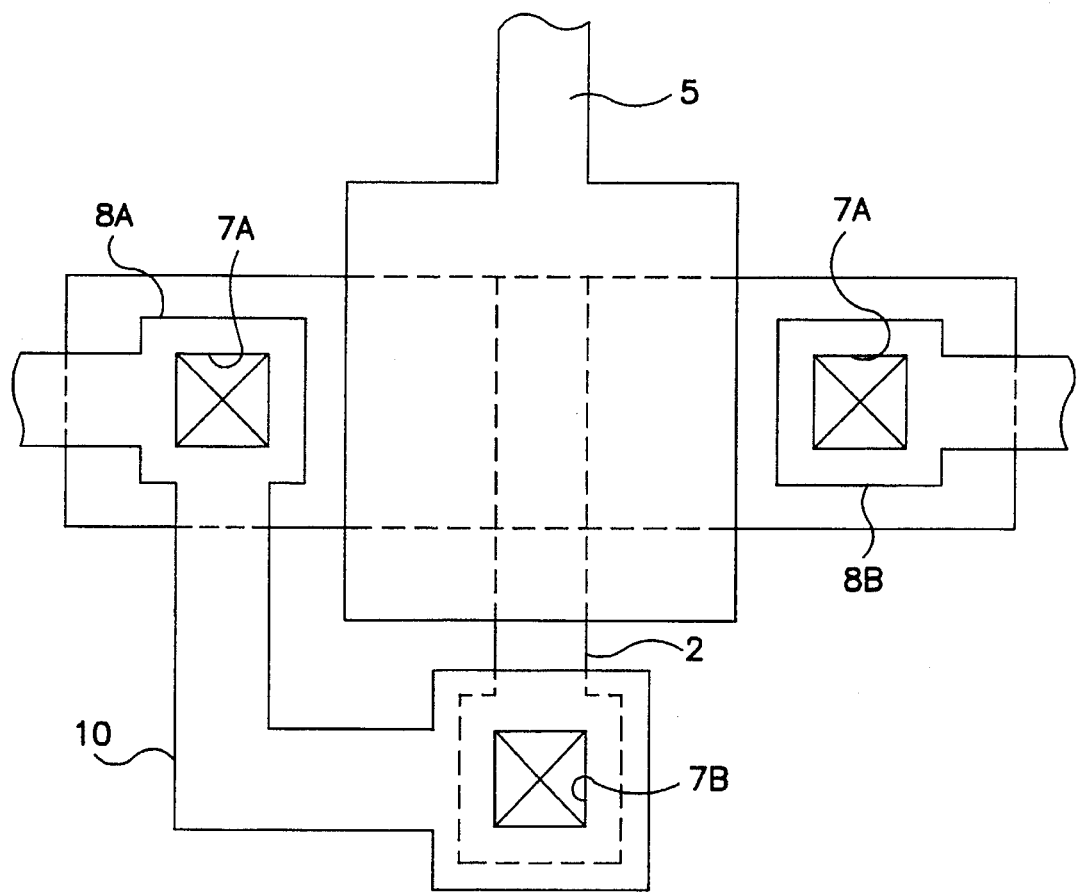
FIGS. 4A and 4B are diagrammatic layout patterns of the first and third embodiments of the TFT in accordance with the present invention.

As shown in a plan view or a layout pattern diagram of the TFT of FIG. 4A, the deposited and patterned aluminum film includes a wiring conductor 10 which extends from the source electrode 8A to a position above one end of the back gate electrode 2 projected from the channel region 3, and which is electrically connected to the back gate electrode 2 through a contact hole 7B formed in the surface protection layer 7.

Thus, the N-channel TFT is completed. The TFT thus completed has the layout pattern diagram shown in FIG. 4A.

In the TFT mentioned above, the back gate electrode of the silicide formed under the polysilicon layer of the channel region is connected to a source potential, or a ground potential. With this back gate having the fixed potential, it is possible to prevent drop of the breakdown voltage caused by the impact ionization, since generation of carriers caused by the impact ionization and accumulation of the carriers are prevented by the back gate having the fixed potential.

Figure 2A:
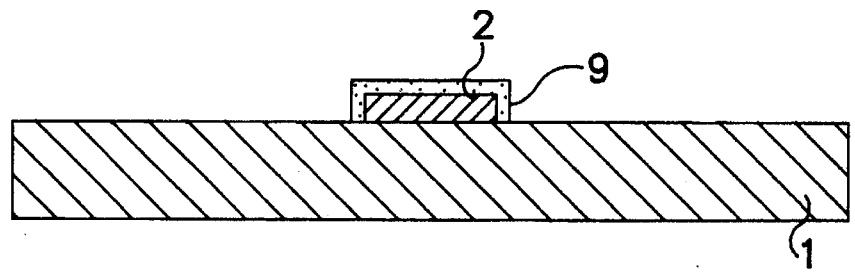
FIGS. 2A and 2B are diagrammatic sectional views of the TFT illustrating a process of manufacturing a second embodiment of the TFT in accordance with the present invention.
Figure 2B:
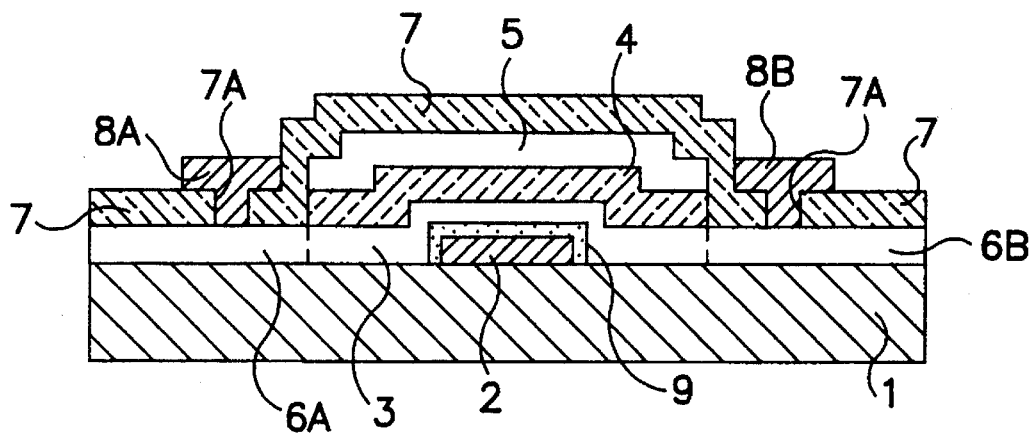

Referring to FIGS. 2A and 2B, there are shown diagrammatic sectional views of the TFT illustrating a process of manufacturing a second embodiment of the TFT in accordance with the present invention.

First, similarly to the first embodiment, the back gate electrode 2 of the silicide is formed on the underlying insulating layer 1, and then, differently from the first embodiment, a CVD oxide silicon film 9 having a thickness of 2 nm to 5 nm is formed to completely cover an exposed surface of the back gate electrode 2, as shown in FIG. 2A.

Thereafter, similarly to the first embodiment, the polysilicon layer 3, the gate oxide film 4, the gate electrode 5, the high concentration source and drain regions 6A and 6B, the surface protection film 7 and the source and drain electrodes 8A and 8B are formed as shown in FIG. 2B. Thus, the N-channel TFT is completed.

In the second embodiment, the CVD oxide silicon film 9 interposed between the back gate electrode 2 of the silicide and the channel region of the polysilicon layer 3, prevents reaction between the silicide and the polysilicon. On the other hand, since the CVD oxide silicon film 9 itself is extremely thin, the back gate electrode 2 and the polysilicon layer 3 of the channel region are electrically interconnected by a tunnel current. In a manufacturing process, therefore, it becomes possible to perform a high temperature treatment at a temperature not less than 1000° C.

Referring to FIGS. 3A to 3D, there are shown diagrammatic sectional views of the TFT illustrating a process of manufacturing a third embodiment of the TFT in accordance with the present invention.

Figure 3A:
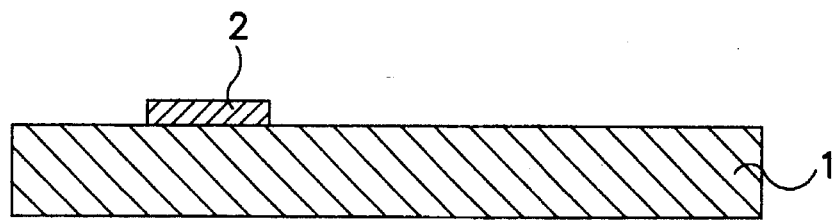
FIGS. 3A to 3D are diagrammatic sectional views of the TFT illustrating a process of manufacturing a third embodiment of the TFT in accordance with the present invention.

For manufacturing the third embodiment of the TFT, first, a back gate electrode 2 of a silicide layer is formed on an underlying insulating layer 1 as shown in FIG. 3A.

Figure 3B:
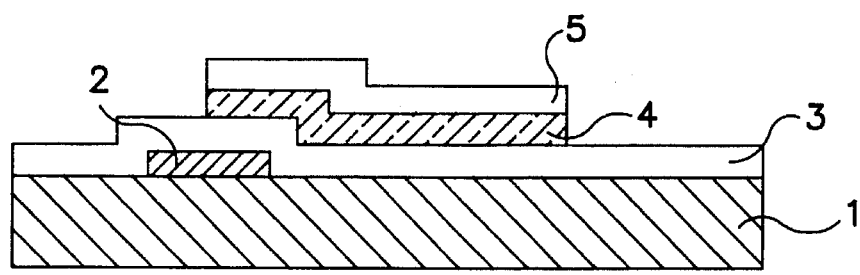

Thereafter, a polysilicon layer 3 is formed to cover the back gate electrode 2 and the underlying insulating layer 1, and a gate oxide film 4 and a gate electrode 5 are formed in the named order on the polysilicon layer 3 as shown in FIG. 3B. In this third embodiment, the stacked layer of the gate oxide film 4 and the gate electrode 5 is located to partially overlap the back gate electrode 2, for example, one half of the back gate electrode 2. Namely, the remaining half of the back gate electrode 2 is located under a portion of tile polysilicon layer 3 which is not covered by the stacked layer of tile gate oxide film 4 and the gate electrode 5 and which will therefore constitute a source region in future.

Figure 3C:
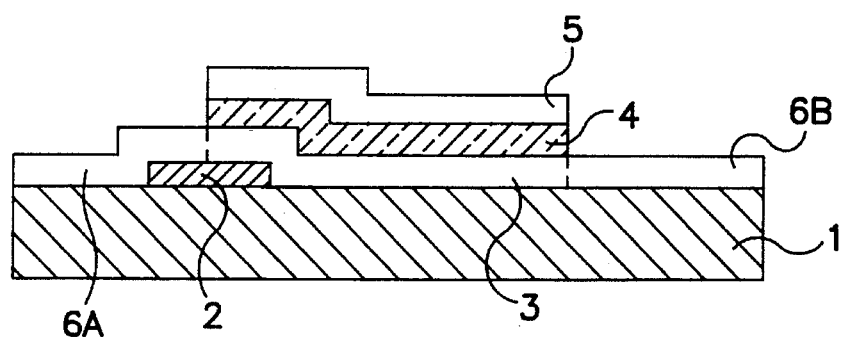

Furthermore, by using the stacked structure of the gate oxide film 4 and the gate electrode 5 as a mask, arsenic is ion-implanted so that high concentration N-type source and drain regions 6A and 6B are formed in the polysilicon layer 3 in alignment with tile stacked structure of the gate oxide film 4 and the gate electrode 5, as shown in FIG. 3C. Thus, a channel region is formed directly under tile gate oxide film 4, contiguously to the source and drain regions 6A and 6B.

Figure 3D:
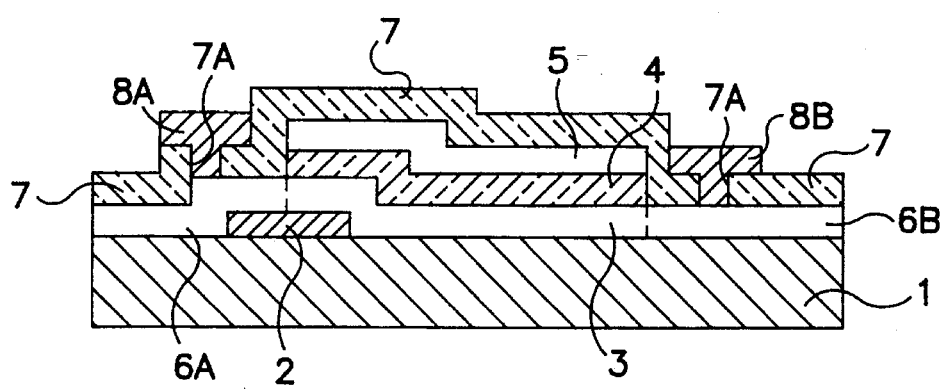

Thereafter, as shown in FIG. 3D, a surface protection layer 7 formed of a CVD oxide silicon film is deposited to completely cover the source and drain regions 6A and 6B and the stacked structure of the gate oxide film 4 and the gate electrode 5, and then, a contact hole is formed through a portion of the surface protection layer 7 above each of the source and drain regions 6A and 6B. Source and drain electrodes 8A and 8B of aluminum are respectively formed in contact with the source and drain regions 6A and 6B through a contact hole 7A.

Thus, the N-channel TFT is completed. A plan view or a layout pattern diagram of the TFT thus completed is shown in FIG. 4B.

Figure 4B:
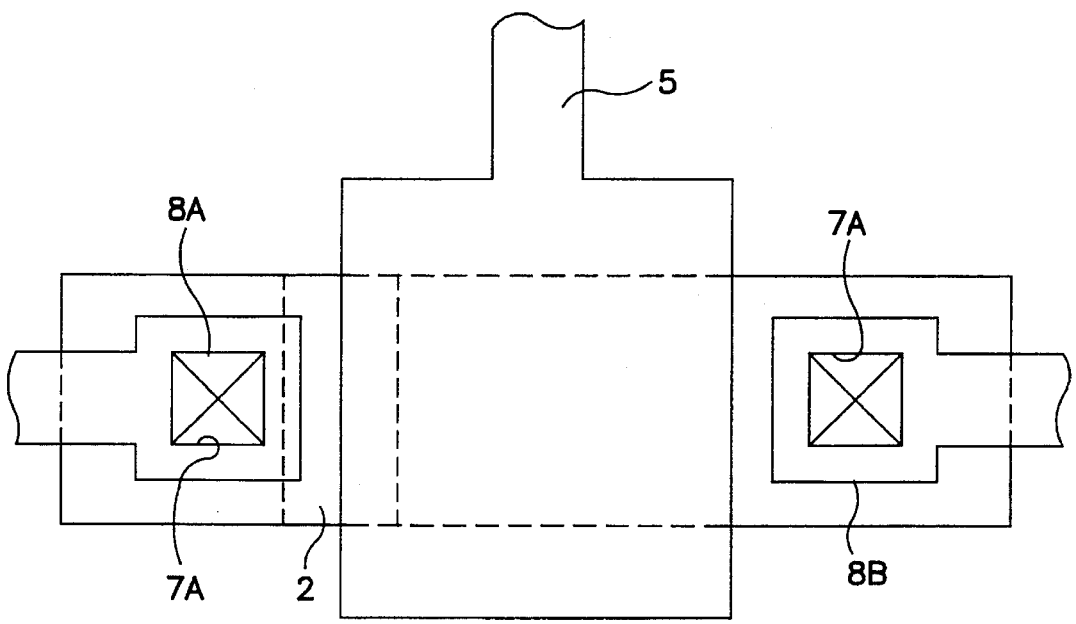

In this third embodiment, as will be understood from FIG. 3D and the layout pattern diagram of FIG. 4B, since the back gate electrode 2 is directly connected to the source region 6A of the high impurity concentration, a wiring conductor for fixing the potential of the back gate electrode becomes unnecessary. Therefore, the third embodiment is simplified in comparison with the first embodiment.

In the N-channel TFT in accordance with the present invention, since the back gate electrode is formed and a potential of the back gate electrode is fixed, the TFT can have the breakdown voltage not less than 20 V, which is remarkably higher than the source-drain breakdown voltage of the conventional TFT on the order of 9 V to 10 V. Accordingly, the N-channel TFT in accordance with the present invention can have a remarkably increased source-drain breakdown voltage.

In addition, since the source/drain regions are formed in a self-alignment to the gate electrode, the dispersion of the characteristics of the TFTs can be greatly reduced in comparison with the conventional TFTs having the offset structure.

The invention has thus been shown and described with reference to the specific embodiments. However, it should be noted that the present invention is in no way limited to the details of the illustrated structures but changes and modifications may be made within the scope of the appended claims.

I claim:

1. A MOS thin film transistor comprising an underlying insulating layer, a back gate electrode formed on an upper surface of said underlying insulating layer, a channel region formed on a silicon layer deposited to cover at least a portion of said back gate electrode, a thin oxide silicon film interposed between said back gate electrode and said silicon layer in order to prevent reaction between said back gate electrode and said silicon layer, said back gate electrode being electrically interconnected to said silicon layer by a tunnel current flowing through said thin oxide silicon film, a gate oxide formed on said channel region, a gate electrode formed on said gate oxide, and a pair of source/drain regions formed at opposite sides of said channel region and contiguous to said channel region, each of said source/drain regions having an impurity concentration higher than that of said channel region.

2. A MOS thin film transistor claimed in claim 1 wherein said thin oxide silicon film is formed of a CVD oxide silicon film having a thickness on the order of 2 nm to 5 nm.

3. A MOS thin film transistor comprising an underlying insulating layer, a back gate electrode formed on an upper surface of said underlying insulating layer, a channel region formed on a silicon layer deposited to cover at least a portion of said back gate electrode, a gate oxide formed on said channel region, a gate electrode formed on said gate oxide, and a pair of source/drain regions formed at opposite sides of said channel region and contiguous to said channel region, each of said source/drain regions having an impurity concentration higher than that of said channel region, said channel region covering a portion of said back gate electrode, and the remaining portion of said back gate electrode being covered with one of said pair of source/drain regions which constitutes a source region, so that said back gate electrode is electrically coupled directly to said source region.

4. A MOS thin film transistor comprising an underlying insulating layer, a back gate electrode formed on an upper surface of said underlying insulating layer, a silicon layer deposited on said underlying insulating layer completely covering said back gate electrode, a thin oxide silicon film interposed between said back gate electrode and said silicon layer in order to prevent reaction between said back gate electrode and said silicon layer, said back gate electrode being electrically interconnected to said silicon layer by a tunnel current flowing through said thin oxide silicon film, a gate oxide selectively formed on said silicon layer so as to overlap at least a portion of said back gate electrode, a gate electrode formed on said gate oxide, a portion of said silicon layer covered with said gate oxide forming a channel region, a portion of said silicon layer not covered with said gate oxide and positioned at each of opposite sides of said gate oxide having a high impurity concentration so as to form a source/drain region contiguous to said channel region, a protection insulating film coat covering a stacked layer of said gate oxide and said gate electrode and said each source/drain region, and a source/drain electrode formed on said protection insulating film above said each source/drain region and electrically connected to said each source/drain region through a contact hole formed through said protection insulating film.

5. A MOS thin film transistor claimed in claim 4 wherein said thin oxide silicon film is formed of a CVD oxide silicon film having a thickness on the order of 2 nm to 5 nm.

\* \* \* \* \*